United States Patent [19]
Uddin et al.

[11] Patent Number: 5,581,087
[45] Date of Patent: Dec. 3, 1996

[54] RADIATION DETECTOR

[75] Inventors: Ashraf Uddin; Fumio Ueno, both of Kanagawa-ken, Japan

[73] Assignee: Kabushiki Kaisha Toshiba, Kanagawa-ken, Japan

[21] Appl. No.: 384,747

[22] Filed: Feb. 7, 1995

[30] Foreign Application Priority Data

Mar. 15, 1994 [JP] Japan .................................. 6-043620

[51] Int. Cl.$^6$ ................................................ H01L 31/101
[52] U.S. Cl. ........................ 250/370.11; 250/372
[58] Field of Search ............................ 250/370.11, 372; 257/77

[56] References Cited

U.S. PATENT DOCUMENTS

| | | | |
|---|---|---|---|
| 5,049,950 | 9/1991 | Fujii et al. ................................ | 257/57 |
| 5,093,576 | 3/1992 | Edmond et al. .................... | 250/370.01 |

FOREIGN PATENT DOCUMENTS 2532293  2/1977  Germany ........................... 250/361 R

OTHER PUBLICATIONS

"Blue LED's, UV photodiodes and high–temperature rectifiers in 6H–SiC", J. A. Edmond et al., Physica B 185, pp. 453–460 (1993).

"Silicon Carbide UV Photodiodes", D. M. Brown et al., IEEE Transactions On Electron Devices, 40:2(325–333) 1993.

"Silicon carbide ultraviolet photodetectors", R. G. Verenchikova et al., Sov. Phys. Semicond. 26:6(565–568) 1992.

*Primary Examiner*—Constantine Hannaher
*Attorney, Agent, or Firm*—Finnegan, Henderson, Farabow, Garrett & Dunner, L.L.P.

[57] ABSTRACT

A radiation detector includes a photodiode composed of an α-SiC substrate of a first conductivity type, a first α-SiC layer of the first conductivity type epitaxially formed on the α-SiC substrate, a second α-SiC layer of a second conductivity type having higher carriers concentration than the first α-SiC layer and epitaxially formed on the first α-SiC layer, a first electrode formed on the α-SiC substrate in ohmic contact, and a second electrode formed on the second α-SiC layer in ohmic contact; and a phosphor layer disposed on the photodiode to emit ultraviolet-rays by exposure of radiations.

18 Claims, 8 Drawing Sheets

RADIATION DETECTOR

BACKGROUND OF THE INVENTION

1. Field of the Invention

This invention relates to a radiation detector, such as an X-ray detector or a gamma-ray detector, and, more particularly, to a solid state radiation detector capable of developing an electric signal in response to radiation.

2. Description of the Related Art

X-ray detectors are used in such fields as X-ray crystallography, surgical and diagnostic procedures and inspection techniques, for example, and are required to have high quantum efficiency, high resolution, and sharp response.

Several types of solid state X-ray detectors are presently available. For example, a lithium doped Si detector disclosed in R. Clarke et al., Rev. Sci. Instrum. 60, 2280 (1989) is used to detect X-rays in the spectral region below 5 keV. The efficiency of this detector is very low, e.g., about 0.01%. Further, the efficiency decreases with time due to damage caused by X-ray irradiation.

A micro-channel plate (NCP) type detector is described in R. Polichar et al., "X-Ray Detector Physics and Applications", SPIE, Vol. 1736, p. 42 (1992). This NCP type detector requires a power source capable of applying a high bias voltage in the order of kilovolts (kV). Further, a response time is of the order of milliseconds (ms) and the efficiency is about 0.02%.

A monolithic linear arrays type detector is described in "X-Ray Detector Physics and Applications", SPIE, Vol. 1736, p. 42 (1992). This type detector also requires a high voltage power source, e.g., kV order, and a response time is of the order of microseconds (μs) and the efficiency is about 0.01%.

There is a need, therefore, for improvements in such detectors to provide higher efficiency and sensitivity, to enable operation at low bias voltages, under high temperatures, and without damage due to exposure to X-rays, and to provide a short response time.

SUMMARY OF THE INVENTION

The present invention has been made in view of the above circumstances and has as an object to provide a solid state radiation detector which substantially avoids the problems and deficiencies of the prior art.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the radiation detector of this invention comprises an ultraviolet-ray detecting portion including a first $\alpha$-SiC layer of a first conductivity type, and a second $\alpha$-SiC layer of a second conductivity type having higher carrier concentration than the first $\alpha$-SiC layer and disposed on the first $\alpha$-SiC layer so as to provide a pn junction, and an ultraviolet-ray emitting portion including a phosphor layer disposed on the photodiode portion to emit ultraviolet-rays to the photodiode portion upon exposure to radiation.

In another aspect, the present invention also provides a radiation detector comprising a photodiode including an $\alpha$-SiC substrate of a first conductivity type, a first $\alpha$-SiC layer of the first conductivity type epitaxially formed on the $\alpha$-SiC substrate, a second $\alpha$-SiC layer of a second conductivity type having higher carrier concentration than the first $\alpha$-SiC layer and epitaxially formed on the first $\alpha$-SiC layer, a first electrode formed on and in ohmic contact with the $\alpha$-SiC substrate, and a second electrode formed on and in ohmic contact with the second $\alpha$-SiC layer. A phosphor layer is disposed on the photodiode to emit ultraviolet-rays upon exposure to radiations.

In still another aspect, the present invention provides a radiation detector comprising an ultraviolet-ray detecting portion including a first $\alpha$-SiC layer of a first conductivity type, an insulator layer disposed on the first $\alpha$-SiC layer, and a conductive layer disposed on the insulator layer so as to provide MIS (Metal-Insulator-Semiconductor) junction, and an ultraviolet-ray emitting portion including a phosphor layer disposed on the photodiode portion so as to emit ultraviolet-rays to the photodiode portion upon exposure to radiations.

BRIEF DESCRIPTION OF THE DRAWINGS

The accompanying drawings, which are incorporated in and constitute a part of this specification illustrate embodiment(s) of the invention and, together with the description, serve to explain the objects, advantages and principles of the invention. In the drawings.

DETAILED DESCRIPTION OF THE PREFERRED EMBODIMENTS

A radiation detector of the present invention is composed of two portions, that is, one portion is an ultraviolet-ray emitting portion to emit ultra-violet (UV) rays upon irradiation by X-rays or gamma-rays, i.e., radiations. The other portion is a UV-ray detecting portion to detect UV-rays emitted from the UV-ray emitting portion.

The UV-ray emitting portion includes a phosphor layer that converts radiations, e.g., X-rays, to UV-rays, which have a wavelength, for example, between about 200 to about 400 nm. Phosphors which emit UV-rays, in general, have a short afterglow, that is, emission stops immediately after irradiation by X-rays is stopped.

Table 1 shows phosphors which can be used in the phosphor layer.

TABLE 1

| phosphor | emitted light wavelength (nm) | reference (given below) |
|---|---|---|
| $Y_2O_3$:Gd | 300–322 | a |
| $Lu_2O_3$:Gd | 312–316 | a |
| $Sc_2O_3$:Gd | 312–316 | a |
| $(Sr,Ba,Mg)_3Si_2O_7$:$Pb^{2+}$ | 250–450 | b |
| $Sr_2Si_3O_8 \cdot 2SrCl_2$:$Er^{2+}$ | 150–400 | b |
| $Ba_3MgSi_2O_8$:$Er^{2+}$ | 150–400 | b |
| $(Sr,Ba)Al_2Si_2O_8$:$Eu^{2+}$ | 150–400 | b |
| $Y_2SiO_5$:$Ce^{3+}$,$Tb^{3+}$ | 150–400 | b |
| $BaF_2$:Ce | 200–400 | c |
| $LaPO_4$:$Eu^{3+}$ | 150–350 | d | references
a: L. H. Brixner et al., J. Solid State Chem., 89,138 (1990)
b: Ohmsha Keikoutai Handbook, p. 221–223 (1987)
c: R. Visser et al., J. Phys. Condens. Natter, 5, 1659 (1993)
d: W. van Schaik et al., J. Electrochem. Soc., 140, 216 (1993)

The U/V-ray detecting portion of the radiation detector includes a photodiode to generate a current under a bias voltage during irradiation of UV-rays. The photodiode is formed by layers of alpha-type silicon carbide ($\alpha$-SiC), that is, a hexagonal silicon carbide (e.g. 6H:SiC). Since $\alpha$-SiC is transparent to X-rays, the photodiode of $\alpha$-SiC is not subject to damage caused by X-ray irradiation. Moreover, since $\alpha$-SiC has a wide band-gap, the photodiode of $\alpha$-SiC can operate under high temperatures in the range of about 1000° C. and higher.

The photodiode includes a first $\alpha$-SiC layer of a first conductivity type, and a second $\alpha$-SiC layer of a second conductivity type disposed on the first $\alpha$-SiC layer. A bias voltage is in a range of about 2.0 to about 4.0 V. A response time is in the range of nanoseconds (ns). Further, efficiency could be more than 1%.

Therefore, since a radiation detector of the present invention includes a UV-ray photodiode of $\alpha$-SiC and a phosphor layer to convert X-rays (gamma-rays) to UV-rays, the radiation detector of the present invention can operate under a low bias voltage with high efficiency, high sensitivity, a short response time, and high resistance to X-rays irradiation.

Figure 1:
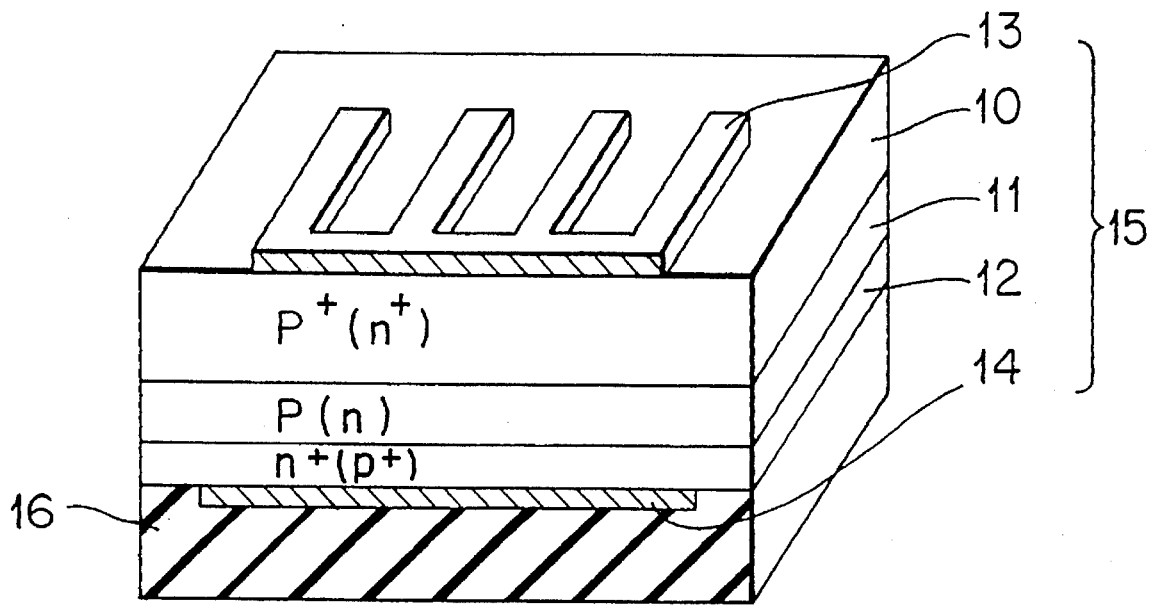
FIG. 1 is a conceptual perspective view in partial cross-section of a radiation detector embodiment according to the present invention.

In FIG. 1 of the drawings, a radiation detector embodiment of the present invention is shown to include a first $\alpha$-SiC layer 11 of p-type, epitaxially formed on an $\alpha$-SiC substrate 10 of $p^+$-type $\alpha$-SiC. A second $\alpha$-SiC layer 12 of $n^+$-type, which has a larger carrier concentration than the first $\alpha$-SiC layer 11, is epitaxially formed on the first $\alpha$-SiC layer 11.

A first electrode 13 of Ti/Au, for example, is formed on and in ohmic contact with substrate 10. A second electrode 14, Ni/Al, for example, is formed on and in ohmic contact with second $\alpha$-SiC layer 12.

As a result, a U/V-ray photodiode 15 having $p/n^+$ junction is provided.

A phosphor layer 16 is disposed on the second $\alpha$-SiC layer 12. Phosphor layer 16 is of a phosphor which can emit UV-rays, e.g., wavelength of 250 to 350 nm, by irradiation of X-rays or gamma-rays. The thickness of the phosphor layer 16 is preferably less than the depth of penetration by radiation, e.g., 1 to 50 μm for X-rays.

A shallow $p/n^+$ junction is required to obtain a good sensitivity for U/V-rays. Therefore, the thickness of the second $\alpha$-SiC layer 12 is preferably in a range of from about 100 nm to about 500 nm. Further, a carrier concentration of the second $\alpha$-SiC layer, preferably using Nitrogen as a dopant, is preferably in a range of from about $1\times10^{18}$ $cm^{-3}$ to about $10\times10^{18}$ $cm^3$.

The carrier concentration of the first $\alpha$-SiC layer 11, using Aluminum or boron as a dopant, is preferably in a range of from about $1\times10^{17}$ $cm^{-3}$ to about $5\times10^{17}$ $cm^{-3}$. Further the thickness of the first $\alpha$-SiC layer 11 is preferably from about 1 to about 5 μm.

The carrier concentration of the substrate 10 is required to be sufficiently high so as to obtain a low resistance and make a good ohmic contact with first electrode 13, e.g., from about $0.5\times10^{18}$ $cm^{-3}$ to about $10\times10^{18}$ $cm^{-3}$. The thickness of the substrate 10 is required to be sufficiently thick so as to provide sufficient strength, e.g., between about 1 and about 5 μm. Excessive thickness of substrate 10 causes the detector to be unduly heavy.

Liquid phase epitaxy or chemical vapor deposition, i.e., a method not having a high temperature step, is preferable to obtain a good $p/n^+$ junction. Etching by RIE with $NF_2/O_2$ gas mixture is used to thin or reduce the thickness of the second $\alpha$-SiC layer 12.

The first and second electrodes 13 and 14 are preferably comb-shaped or mesh-shaped so that X-rays and UV-rays reach the $p/n^+$ junction with high efficiency. Further, to obtain a good ohmic contact, annealing in inert atmosphere, e.g., an Ar atmosphere, is preferred.

Further, a gradient doping in the first $\alpha$-SiC layer 11, in which a doping concentration on the side in contact with the substrate 10 is lower relative to the side in contact with the second $\alpha$-SiC layer 12, is effective to increase the efficiency of the photodiode, since a depletion layer at the $p/n^+$ junction is enlarged.

Figure 2:
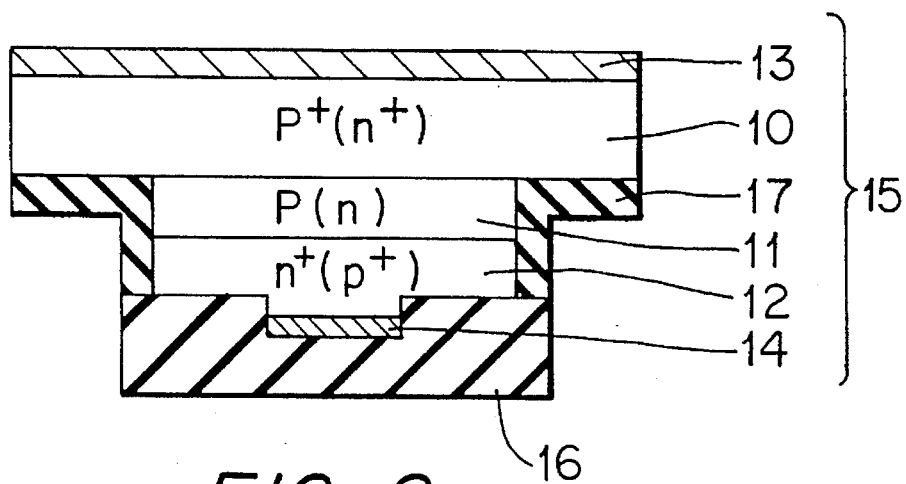
FIG. 2 is a conceptional cross-sectional view of another radiation detector embodiment according to the present invention.

In FIG. 2, an alternative radiation detector embodiment is shown as a mesa-shaped structure comprising first and second $\alpha$-SiC layers 11 and 12. A side surface of the photodiode, i.e., an end of the $p/n^+$ junction, is preferably coated with a side insulator layer 17 so as to reduce a leakage current.

Figure 3:
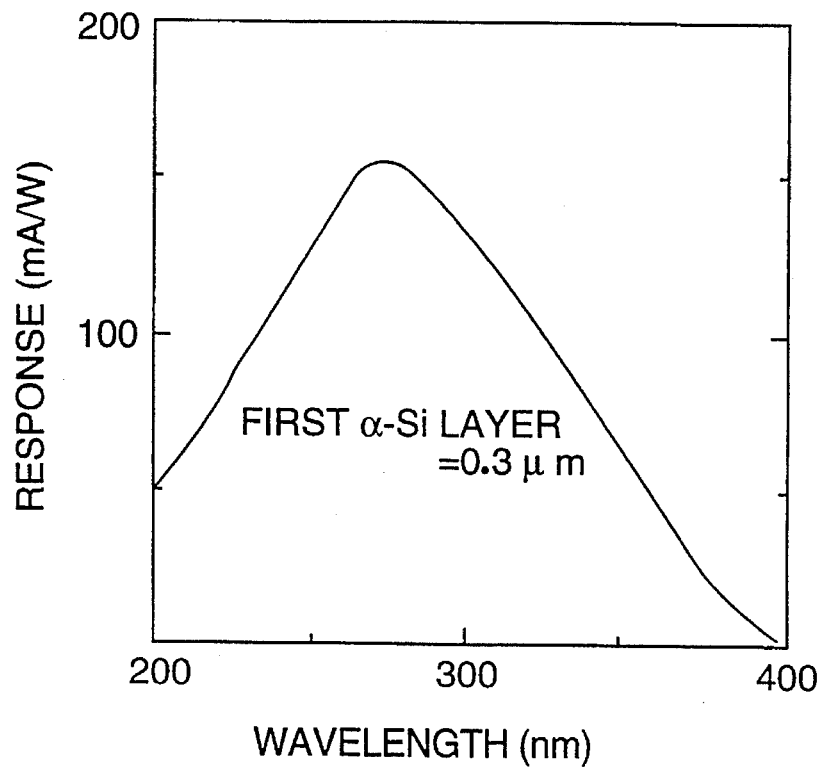
FIG. 3 is a graph showing a response spectrum of a photodiode of another radiation detector embodiment according to the present invention.

FIG. 3 shows the response spectrum of a photodiode in which the carrier concentration of the first $\alpha$SiC layer 11 is graded from a carrier concentration of from about $1\times10^{17}$ cm$^{-3}$ to about $5\times10^{17}$ cm$^{-3}$, at the side located at the substrate 10, to a carrier concentration of from about $5\times10^{17}$ cm$^{-3}$ to about $10\times10^{17}$ cm$^{-3}$ at the side located at the second α-SiC layer 12. The carrier concentration of the second α-SiC layer 12 is from about $5\times10^{18}$ cm$^{-3}$ to about $10\times10^{18}$ cm$^{-3}$. The thickness of the first α-SiC layer 11 is from about 1000 nm to about 5000 nm. The thickness of the second α-SiC layer 12 is from about 100 to about 500 nm. The response spectrum has a peak at a wavelength of about 270 nm.

Figure 4:
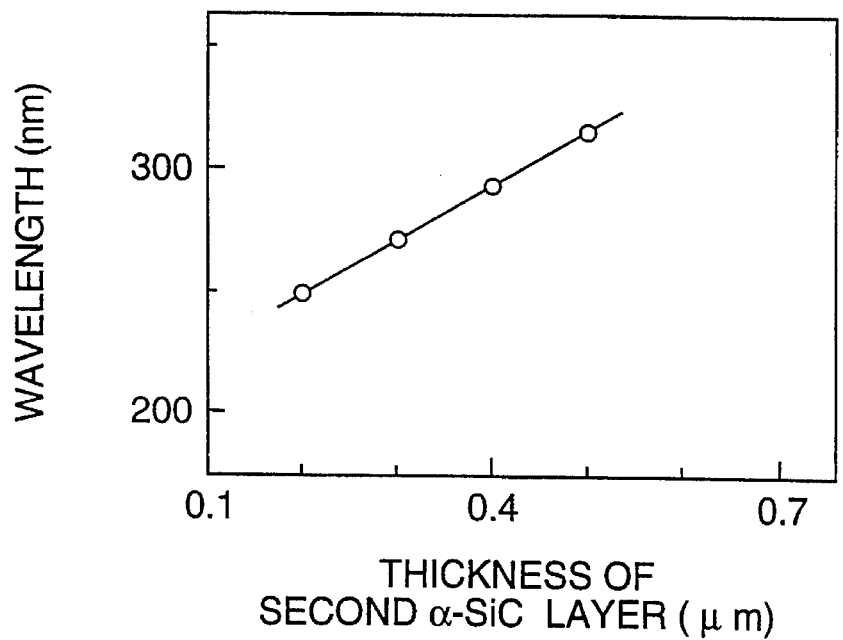
FIG. 4 is a graph showing a peak shift of a photodiode in the radiation detector of FIG. 3.

FIG. 4 shows a response peak shift due to variation in the thickness of the second α-SiC layer 12 of the photodiode described in the preceding paragraph and represented by FIG. 3. The peak shifts shorter wavelengths with decreasing thicknesses of the second α-SiC layer 12.

Since this photodiode is most sensitive in a region around a wavelength of 300 nm, the phosphor of the phosphor layer 16 is selected so as to emit UV-rays having a wavelength of about 300 nm.

Figure 5:
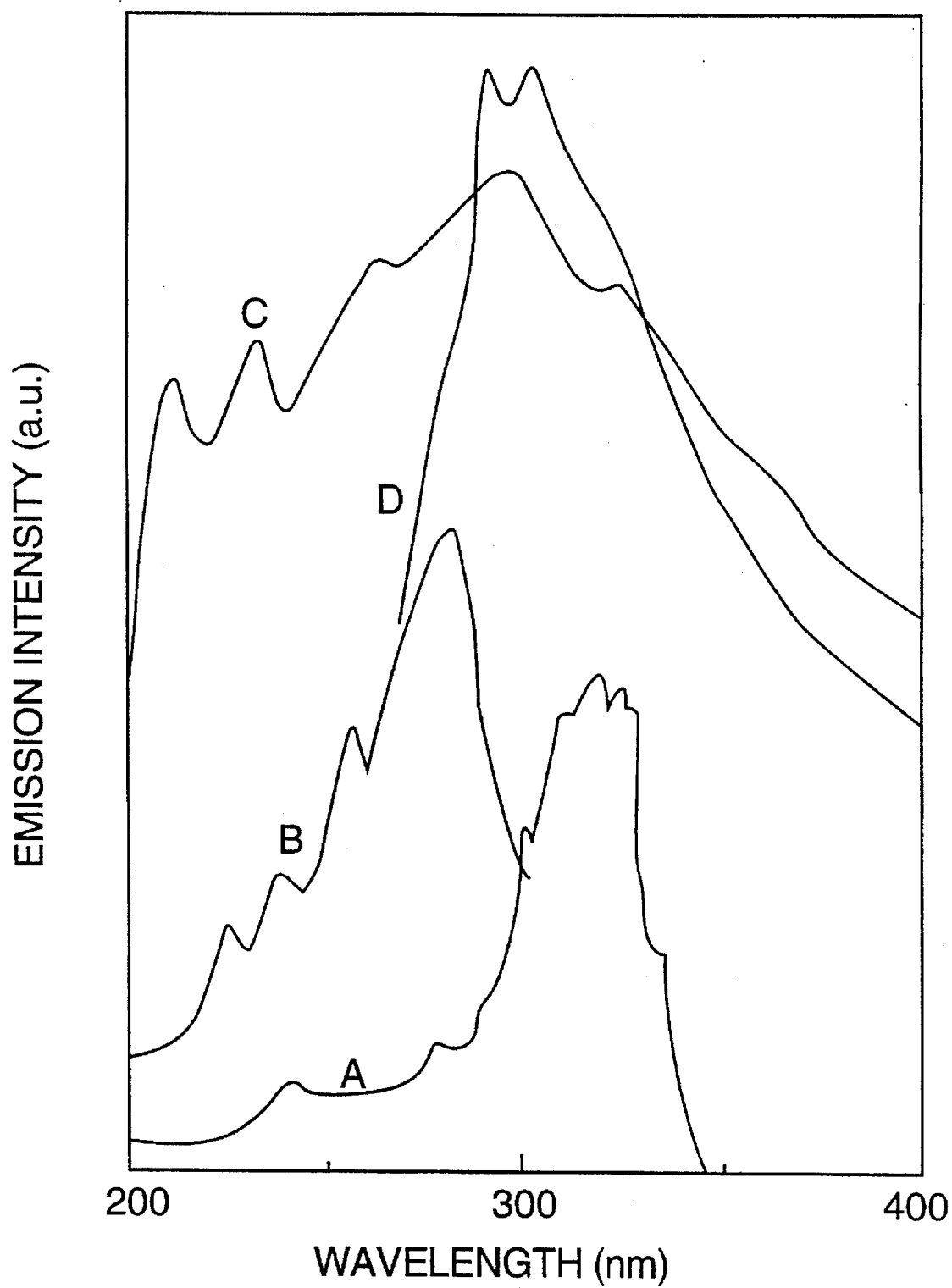
FIG. 5 is a graph showing emission spectra of several phosphors usable in a radiation detector of the present invention.

FIG. 5 shows emission spectra of several phosphors for emitting UV-rays having a wavelength around 300 nm, the different phosphors being represented by curves A, B, C and D. Thus, in FIG. 5, curve A represents a phosphor of $y_{1.98}Gd_{0.02}O_3$ described in reference (a) of table 1; curve B represents a phosphor of $LaPO_4:Eu^{3+}$ (0.5 mol %) described in reference (d) of table 1; curve C represents a phosphor of $BaF_2:Ce(0.0012$ mol %) described in reference (c) of table 1; and curve D represents a phosphor of $BaF_2:Ce(0.17$ mol %) described in reference (c) of table 1.

The peak emission intensity for each phosphor is from about 1% to about 3% of X-ray intensity. The lifetime of each emission spectra is in the order of nanoseconds.

Figure 6:
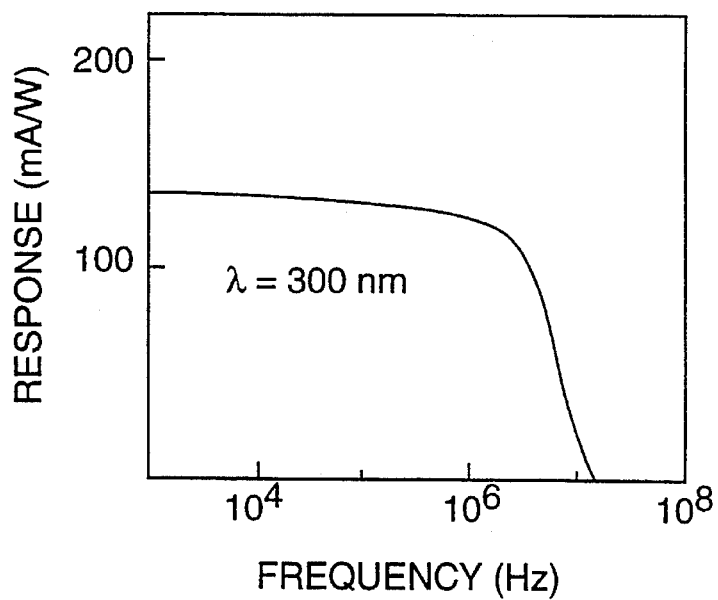
FIG. 6 is a graph showing a frequency response of a photodiode in a radiation detector according to the present invention.

FIG. 6 shows the frequency response of the photodiode represented by FIG. 3 at a wavelength of 300 nm. The photodiode can detect frequencies up to about $10^7$ Hz. The response time is less than 100 ns.

Figure 7:
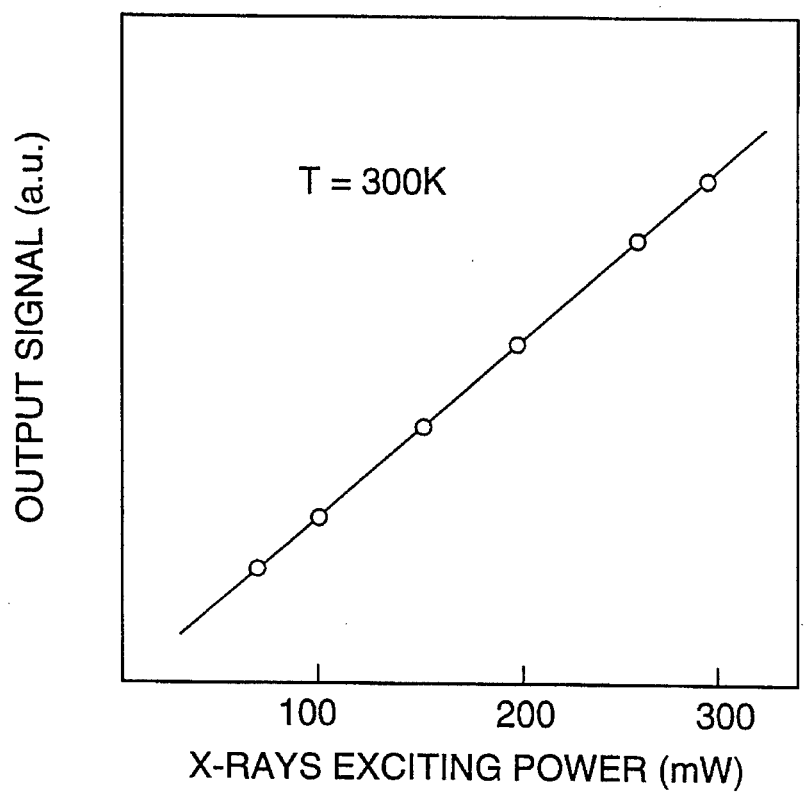
FIG. 7 is a graph showing a relation between X-ray exciting power and output signal in a radiation detector according to the present invention.

FIG. 7 shows a relation between X-ray exciting power and output signal of an X-ray detector. The relation is linear.

In the above-mentioned embodiments, the photodiode provides a p/n$^+$ junction. However, photodiodes providing an n/p$^+$ junction, as represented by parenthetic designation in FIGS. 1 and 2, for example, obtain the same effect as photodiodes providing a p/n$^+$ junction.

Figure 8:
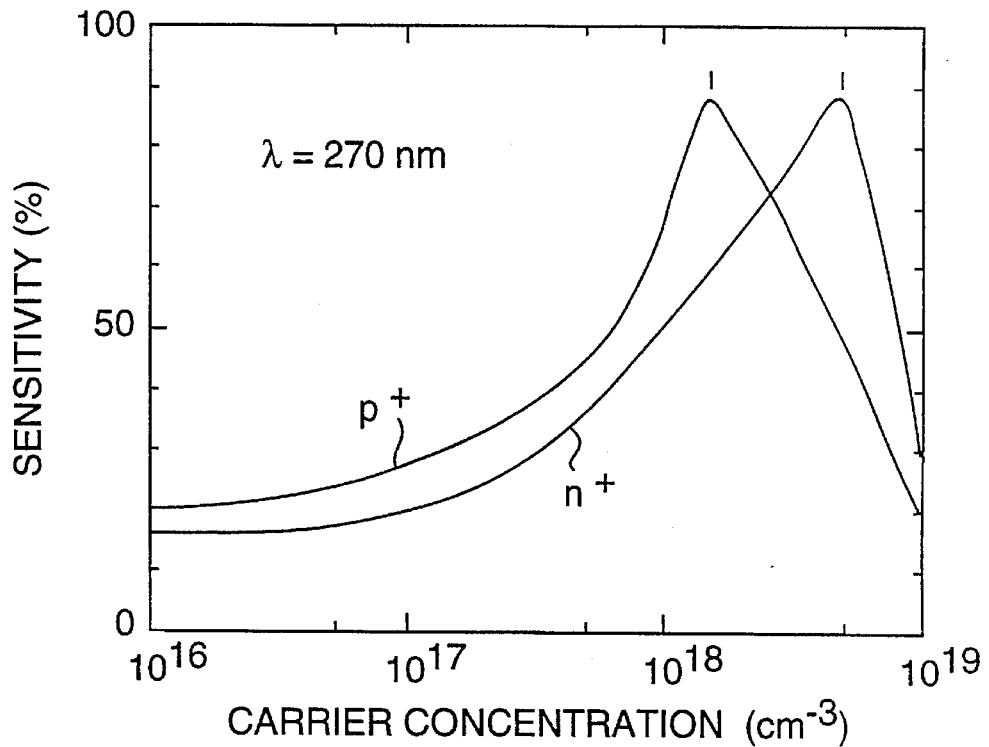
FIG. 8 is a graph showing a relation between sensitivity and carrier concentrations in a second $\alpha$-SiC layer of the present invention.

FIG. 8 is a graph showing the relation between a carrier concentration of the second α-SiC layer 12 of n$^+$ and a sensitivity of the photodiode of FIG. 3, i.e., a ratio of an output power to and irradiation energy. The wavelength of X-ray irradiation is 270 nm. FIG. 8 shows that the carrier concentration of the second α-SiC layer 12 is preferably from about $1\times10^{18}$ cm$^{-3}$ to about $7\times10^{18}$ cm$^{-3}$. The photodiode having a second α-SiC layer 12 of p$^+$, is similar to the photodiode having a second αSiC layer 12 of n$^+$, i.e., the concentration of second α-SiC layer 12 is preferably from about $0.5\times10^{18}$ cm$^{-3}$ to about $5\times10^{18}$ cm$^{-3}$.

Figure 9:
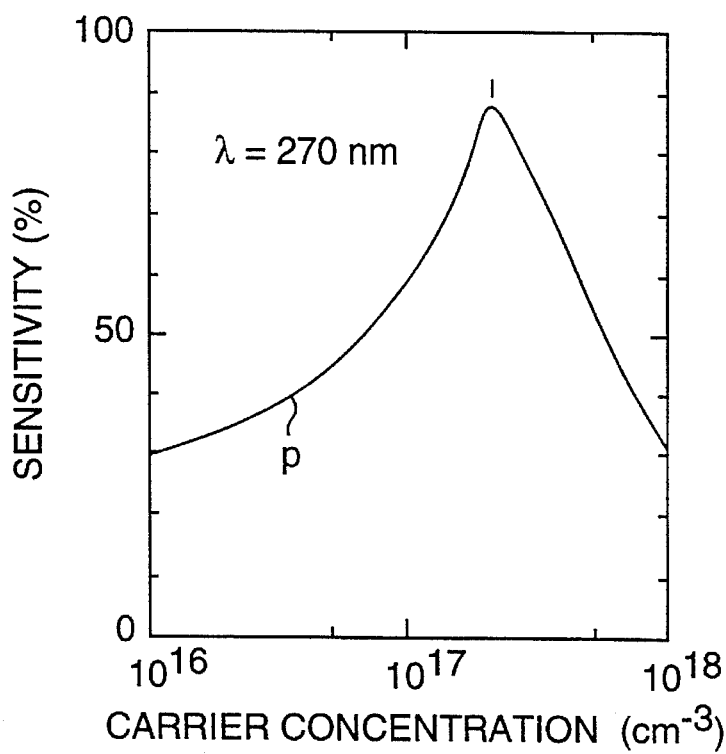
FIG. 9 is a graph showing a relation between sensitivity and carrier concentration of a first $\alpha$-SiC layer of the present invention.

FIG. 9 is a graph showing a relation between the carrier concentration of a first α-SiC layer 11 of the photodiode of FIG. 3 of n$^+$ and a sensitivity to X-rays having a wavelength of 270 nm. FIG. 9 shows that the concentration of the first α-SiC layer 11 is preferably from about $0.5\times10^{17}$ cm$^{-3}$ to $5\times10^{17}$cm$^{-3}$. A photodiode having a first α-SiC layer 11 of p$^+$, is similar to a photodiode having first α-SiC layer 11 of n.

Figure 10:
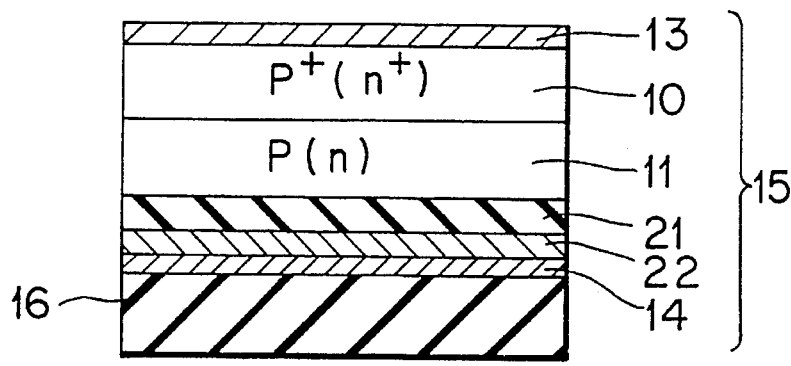
FIG. 10 is a conceptual cross-sectional view of another radiation detector embodiment according to the present invention.

FIG. 10 shows a cross-sectional view of a radiation detector of another embodiment of the present invention, providing an MIS (Metal-Insulator-Semiconductor) junction.

A first α-SiC layer 11 is epitaxially formed on an α-SiC substrate 10 in the same way as in the embodiment of FIG. 1. An insulator layer 21 is formed on the first α-SiC layer 11, e.g., an oxide layer of α-SiC or silicon oxide layer is deposited on the first α-SiC layer 11. A conductor layer 22 of Cr, Au, Ti, Pb, for example, is formed on the insulator layer 21 so as to provide a MIS junction. When UV-rays come from the side of conductor layer 22, the material and the thickness of conductor layer 22 is required to be transparent to UV-rays.

A first electrode 13 is formed on the substrate in ohmic contact with substrate 10 in the same way as in the embodiment of FIG. 1. A second electrode 14 is formed on conductive layer 22. As a result, UV-ray photodiode 15 having MIS junction is provided. A phosphor layer 16 is disposed on conductive layer 22.

The carrier concentration of the first α-SiC layer 11 in FIG. 9 is preferably from about $1\times10^{17}$ cm$^{-3}$ to about $5\times10^{17}$ cm$^{-3}$ and the thickness of first α-SiC layer 11 is preferably from about 1 to about 5 μm. The substrate 10 is preferably α-SiC having a carrier concentration preferably of from about $0.5\times10^{18}$ cm$^{-3}$ to about $10\times10^{18}$ cm$^{-3}$. The thickness of the substrate 10 is preferably from about 1 μm to about 5 μm.

First and second electrodes 13 and 14 in FIG. 9 are preferably comb-shaped or mesh-shaped to enable X-rays and UV-rays to reach the MIS junction with high efficiency. Further, to obtain a good ohmic contact, annealing in inert atmosphere, e.g., Ar atmosphere, is preferred.

The thickness of insulator layer 21 is preferably from about 5 to about 50 nm so as to provide good MIS junction.

Figure 11:
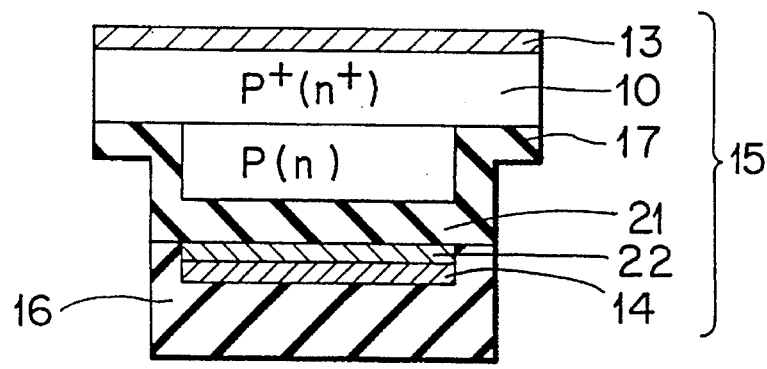
FIG. 11 is a conceptual cross-sectional view of still another radiation detector embodiment according to the present invention.

Furthermore, a side surface of the photodiode, i.e., an end of the MIS junction, is preferably coated with side insulator layer 17 in a mesa-shaped structure comprising the first α-SiC layer 11, the insulator layer 21 and the conductive layer 22, so as to reduce leakage current as shown in FIG. 11. FIG. 11 shows a conceptual cross-sectional view of such a radiation detector of another embodiment of the present invention.

Figure 12:
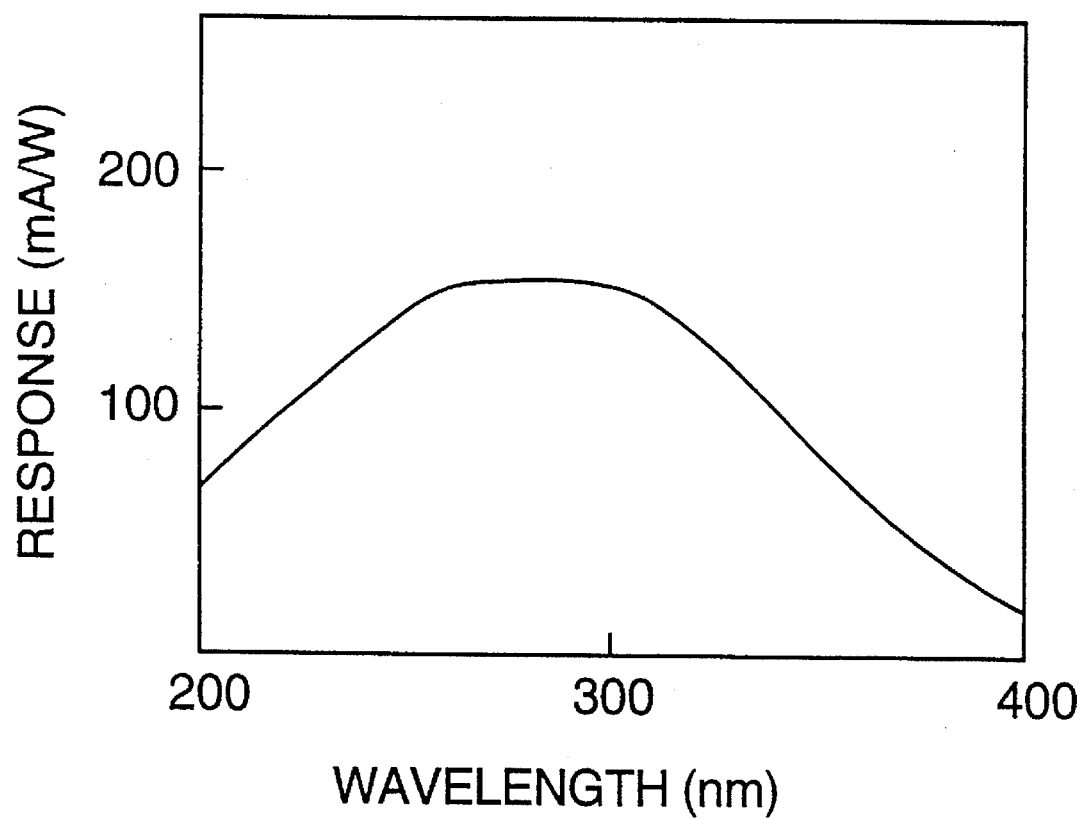
FIG. 12 is a graph showing a response spectrum of a photodiode in a radiation detector according to the present invention.

FIG. 12 shows a response spectrum of a photodiode having a MIS junction, wherein the carrier concentration of the first α-SiC layer 11 is from about $1\times10^{17}$ cm$^{-3}$ to about $5\times10^{17}$ cm$^{-3}$ of p type, a thickness of first α-SiC layer 11 is from about 1000 to about 3000 nm, and a thickness of oxide layer 21 is from about 5 to about 30 nm.

The response spectrum of the MIS junction photodiode has a peak at a wavelength of about 280 nm. However, the spectrum is broader than a photodiode having a p/n$^+$ junction as described with reference to FIG. 3. The peak is shifted with increasing thicknesses of the insulator layer 21 or of the conductor layer 22. When first α-SiC layer 11 is an n-type α-SiC, a similar result is obtained.

The phosphor layer 16 emits UV-rays in all directions. Therefore, a radiation detector according to the present invention preferably includes a mirror.

Figure 13:
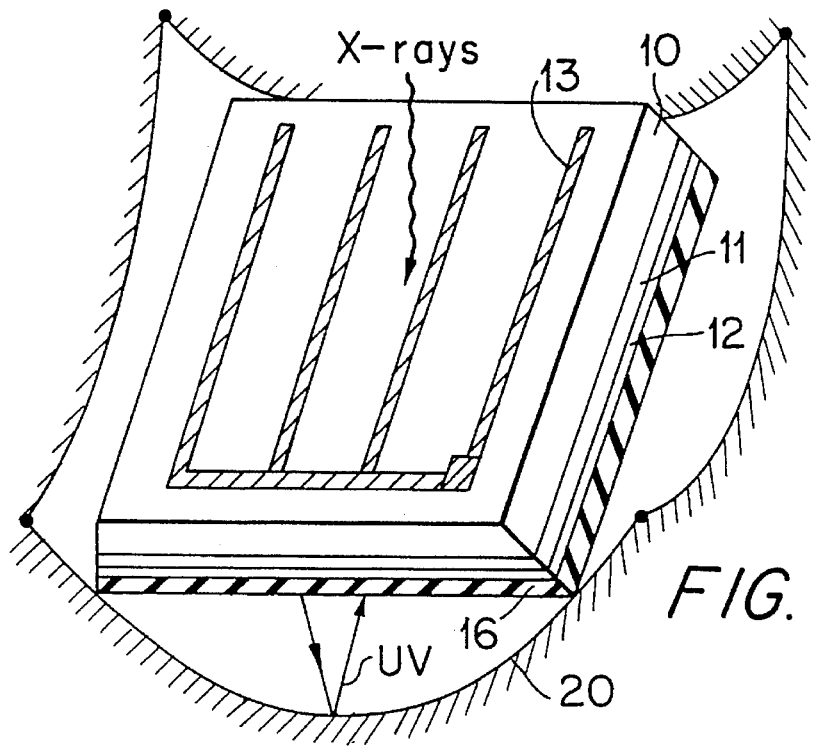
FIG. 13 is a conceptual cross-sectional view of another radiation detector embodiment according to the present invention.
Figure 14:
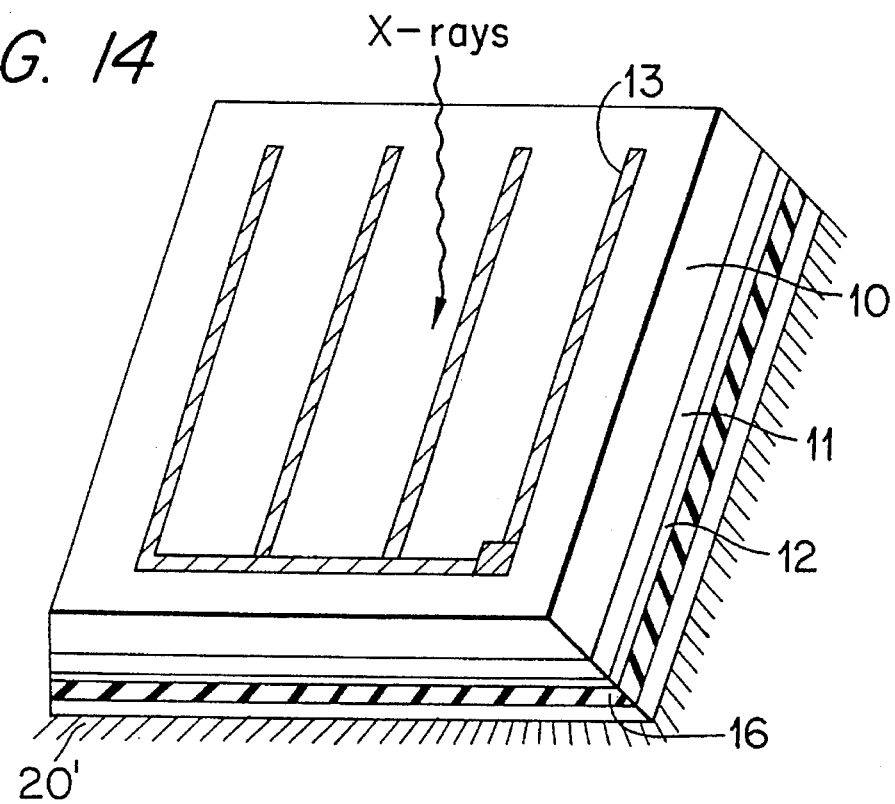
FIG. 14 is a conceptual cross-sectional view of yet another radiation detector embodiment according to the present invention.

FIG. 13 shows the detector providing a concave mirror 20. FIG. 14 shows a detector providing a plane mirror 20'. Both UV-rays emitted directly to photodiode 15 and UV-rays reflected by mirror 20,20' are detected by photodiode 15. Therefore, X-ray detecting efficiency is improved by as much as two times or more.

Figure 15:
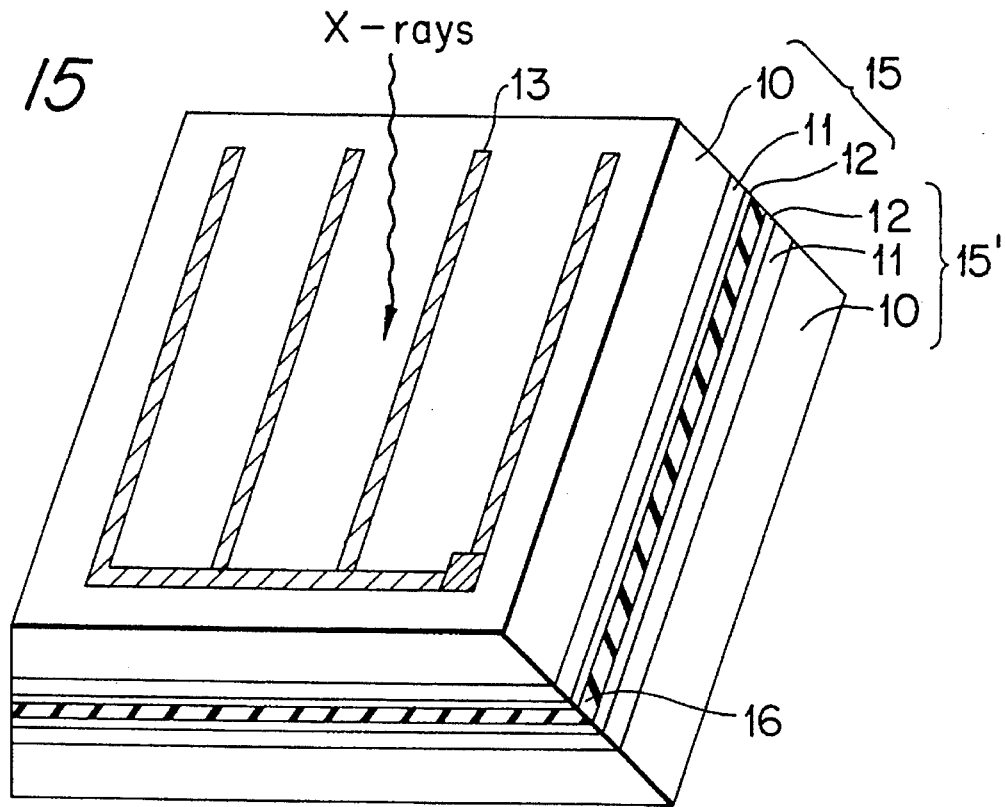
FIG. 15 is a conceptual cross-sectional view of another radiation detector embodiment according to the present invention.

FIG. 15 shows a radiation detector including two UV-ray photodiodes. A phosphor layer 16 is disposed between two UV-ray photodiodes 15 and 15'. Second α-SiC layers 12 or conductive layers 22 in photodiodes 15 and 15' face the phosphor layer 16. Therefore, UV-rays emitted from both sides of phosphor layer 16 can be detected by the photodiodes 15 and 15'. As a result, X-ray detecting efficiency is improved.

Further, when such a radiation detector of FIG. 15 provide different type photodiodes, e.g., p/n junction type and MIS junction type, X-ray detecting efficiency is improved.

Radiation detectors according to the present invention can be irradiated by X-rays from the side of or through the substrate 10, and also from the side of the second α-SiC layer 12 because X-rays are not absorbed by α-SiC. However, to reduce damage to the phosphor layer 16 due to X-ray irradiation, the radiation detector of the invention is preferably irradiated by X-rays from the side of substrate 10.

Phosphor layer 16 could emit UV-rays by irradiation of gamma rays. Therefore, radiation detectors according to the present invention could detect gamma-rays as well as X-rays.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A solid state radiation detector comprising:
   two ultraviolet-ray detecting portions, each including a first α-SiC layer of a first conductivity type, and a second α-SiC layer of a second conductivity type disposed on the first α-SiC layer so as to provide a pn junction; and
   an ultraviolet-ray emitting portion including a phosphor layer disposed between the two detecting portions so as to emit ultraviolet-rays to the detecting portions upon exposure of the phosphor layer to radiations.

2. The radiation detector according to claim 1, wherein the second α-SiC layer has a higher carrier concentration than the first α-SiC layer.

3. The radiation detector according to claim 1, wherein the first α-SiC layer has a carrier concentration gradient in which the carrier concentration is higher at the pn junction.

4. The radiation detector according to claim 1, wherein the second α-SiC layers of the two ultraviolet-ray detecting portions face each other.

5. The radiation detector according to claim 1, further comprising reflecting means for reflecting ultraviolet-rays emitted by the phosphor layer to the detector portions.

6. A solid state radiation detector, comprising:
   two photodiodes, each including;
      an α-SiC substrate of a first conductivity type,
      a first α-SiC layer of the first conductivity type epitaxially formed on the α-SiC substrate and having a first carrier concentration,
      a second α-SiC layer of a second conductivity type having a second carrier concentration higher than the first carrier concentration, and epitaxially formed on the first α-SiC layer,
      a first electrode on and in ohmic contact with the α-SiC substrate, and
      a second electrode on and in ohmic contact with the second α-SiC layer; and
   a phosphor layer to emit ultraviolet-rays upon exposure to radiations, the phosphor layer being disposed between the two photodiodes and the second α-SiC layers of the two photodiodes facing each other.

7. The radiation detector according to claim 6, wherein the first carrier concentration is from about $0.5 \times 10^{17}$ cm$^{-3}$ to about $5 \times 10^{17}$ cm$^{-3}$.

8. The radiation detector according to claim 6, wherein the second α-SiC layer is of n-type and the second carrier concentration is from about $1 \times 10^{18}$ cm$^{-3}$ to about $7 \times 10^{18}$ cm$^{-3}$.

9. The radiation detector according to claim 6, wherein the second α-SiC layer is of p-type and the second carrier concentration is from about $0.5 \times 10^{18}$ cm$^{-3}$ to about $5 \times 10^{18}$ cm$^{-3}$.

10. The radiation detector according to claim 6, wherein the second α-SiC layer has a thickness of from about 100 nm to about 500 nm.

11. The radiation detector according to claim 6, wherein a side surface of the photodiode is covered with an insulator layer.

12. The radiation detector according to claim 6, wherein the phosphor layer has a thickness of about radiation penetration depth or less.

13. The radiation detector according to claim 6, wherein the phosphor layer has a thickness of about 50 μm or less.

14. The radiation detector according to claim 6, wherein the radiation detector is exposed to radiations through the photodiode.

15. The radiation detector according to claim 6, wherein the phosphor layer is disposed on the second α-SiC layer.

16. A solid state radiation detector comprising:
   a first UV-ray photodiode of α-SiC and including one of a p/n junction and a MIS junction;
   a second UV-ray photodiode of α-SiC and including one of a p/n junction and a MIS junction;
   a phosphor layer disposed between the first and second UV-ray photodiodes to emit ultraviolet-rays upon exposure to radiations.

17. The radiation detector according to claim 16, wherein the first UV-ray photodiode includes a p/n junction and the second UV-ray photodiode includes a MIS junction.

18. A solid state radiation detector comprising:
   two ultraviolet-ray detecting photodiode portions, each including a first α-SiC layer of a first conductivity type, an insulator layer disposed on the first α-SiC layer, and a conductive layer to provide a MIS junction; and
   an ultraviolet-ray emitting portion including a phosphor layer disposed between the two photodiode portions so as to emit ultraviolet-rays to the photodiode portions upon exposure to radiations.

* * * * *